(12) United States Patent
Drinkard et al.

(10) Patent No.: US 6,665,621 B2
(45) Date of Patent: Dec. 16, 2003

(54) SYSTEM AND METHOD FOR WAVEFORM PROCESSING

(75) Inventors: John J. Drinkard, Redwood City, CA (US); Javier Onses Cardona, Alameda, CA (US); Christopher Alan Dums, Clayton, NC (US)

(73) Assignee: Scientific Technologies Incorporated, Fremont, CA (US)

( * ) Notice: Subject to any disclaimer, the term of this patent is extended or adjusted under 35 U.S.C. 154(b) by 138 days.

(21) Appl. No.: 09/917,477

(22) Filed: Jul. 27, 2001

(65) Prior Publication Data

US 2002/0065620 A1 May 30, 2002

Related U.S. Application Data

(63) Continuation-in-part of application No. 09/728,567, filed on Nov. 28, 2000, now Pat. No. 6,493,653.

(51) Int. Cl.[7] .............................................. H03K 3/01
(52) U.S. Cl. ..................... 702/66; 702/176; 327/261
(58) Field of Search .......................... 702/66, 176, 177; 375/359, 360, 361; 327/165, 198, 291, 261, 262, 285

(56) References Cited

U.S. PATENT DOCUMENTS

| | | |
|---|---|---|
| 4,507,740 A | 3/1985 | Star |
| 4,701,803 A | 10/1987 | Sato .......................... 382/245 |
| 4,755,951 A | 7/1988 | Hollister |
| 5,103,466 A * | 4/1992 | Bazes .......................... 375/361 |

FOREIGN PATENT DOCUMENTS

DE          2901160 A      7/1980

* cited by examiner

Primary Examiner—Kamini Shah
(74) Attorney, Agent, or Firm—Coats & Bennett, P.L.L.C.

(57) ABSTRACT

A data reduction circuit serves as a post-processor for digitized waveform data, providing reduced data sets for subsequent processing. Preferably, the data reduction circuit receives one or more potentially long sequences of digital waveform data and provides as output sets of sequence numbers corresponding to transitions in the digitized waveforms. In this manner, a processor concerned with the location of waveform transitions is relieved from the burden of processing the sequences just to identify the transition points. In some embodiments, the data reduction circuit cooperates with a waveform digitizer that produces digitized sequences of comparator waveforms in a laser-based distance measuring circuit. Transition points in the digitized waveform correspond to return reflections of emitted laser pulses and may be used to identify laser pulse flight time. Thus, reporting only sequence numbers for the waveform transition points greatly reduces the amount of data transferred to a distance-calculating processor.

33 Claims, 6 Drawing Sheets

FOT(0) = 005                                FOT(1) = 503
NUT(0) = 008                                NUT(1) = 507
```

SYSTEM AND METHOD FOR WAVEFORM PROCESSING

RELATED APPLICATIONS

The present application is a continuation-in-part of application Ser. No. 09/728,567, now U.S. Pat. No. 6,493,653 filed on Nov. 28, 2000, and entitled "TAPPED DELAY HIGH-SPEED REGISTER," the disclosure of which is hereby incorporated by reference herein in its entirety.

BACKGROUND OF THE INVENTION

Many applications rely on captured or recorded waveform data for a variety of purposes, such as signal measurement or characterization. Often, one or more signal waveforms, such as stimulus and response waveforms, are recorded and then analyzed to determine one or more parameters of interest. Such processing may be involved, such as in performing spectral analysis of captured data, or may be relatively straightforward, as in identifying signal transitions within a signal waveform.

One characteristic common to most data recording applications is the accumulation of potentially large data sets. For example, consider that sampling a signal at ten megahertz for a hundred microseconds generates a thousand sample points. Where high-speed sampling is involved or where multiple waveforms are simultaneously sampled, the number of accumulated data samples builds quickly. For example, in the above-incorporated patent application, a tapped delay line high-speed register (the "TDLR") captures one or more channels of high-speed data based on digitizing laser-based distance measuring waveforms.

Often, data is collected or captured in one location or sub-system, and then processed in another. The challenge then is to make these large accumulated data sets available for processing in timely fashion, which may be problematic in terms of moving the data around within a processing system where data transport speeds are practically limited.

Indeed, in some instances, moving large amounts of capture data around within a processing system may prove impractical, or at least undesirable. Thus, an approach to handling waveform data in a way that minimizes the need for transporting it between processing subsystems would reduce overhead. This reduction in overhead may be particularly advantageous in processing systems with limited bandwidth, or with extensive, real-time processing activities that limit the systems' ability to devote much processing time to data transport between processing sub-systems.

BRIEF SUMMARY OF THE INVENTION

The present invention is an apparatus and method for data reduction, particularly in the context of processing digitized waveform data. In applications where potentially large series of digitized waveform data must be managed, the present invention provides data clustering techniques that provide salient waveform information, such as information about waveform transitions, while reducing or eliminating the need for an associated processing system to retrieve the full set of waveform data.

As applied to the TDLR for waveform digitization as disclosed in application Ser. No. 09/728,567, the present invention processes one or more digitized waveforms (capture channel data) and provides a supporting or associated processor with a reduced data set comprising salient waveform information. In particular, clustering in this application provides the supporting processor with sample numbers corresponding to signal transitions, thus eliminating the need for the system processor to examine potentially lengthy sequences of waveform samples to detect such transitions.

As an example, a waveform may be digitized as a sample set of discrete waveform samples, recorded as ones or zeros depending on whether the sampled waveform was above or below a reference threshold at each sample instant. Capture post-processing in accordance with one embodiment of the present invention entails processing the sequence of binary values to identify which samples correspond to signal transitions. As an illustration, assume the capture data consists of five hundred sequential samples, with a zero-to-one transition at the one-hundredth sample and a subsequent one-to-zero sample at the three-hundredth sample. Post-processing reduces the sample set to identification of these signal transition points, greatly reducing the information that must be transferred to the system processor.

Post-processing may be implemented as a data reduction circuit using a microcontroller or microprocessor, but is preferably implemented using programmable logic or using custom integrated circuits. Implementation of the post-processing functionality in logic circuitry permits substantially parallel processing of the captured waveform data, allowing fast data reduction operation. The post-processor circuit may also serve other functions in accordance with particular system needs. For example, with respect to the TDLR, the post-processor circuit may provide a data and test interface between the TDLR and the main system processor.

DETAILED DESCRIPTION OF THE INVENTION

The earlier incorporated co-pending application Ser. No. 09/728,567 details operation of a tapped delay line high-speed registers, otherwise referred to as the "TDLR." In operation, the TDLR digitizes a binary valued waveform as a sequence of sample values, with the sample timing set by a high-speed digital delay line. At each sample point, the TDLR records the state of the input waveform in a memory element comprising part of a "capture channel" as either a "one" or a "zero," indicating whether the input waveform to the TDLR was high or low at the sample instant. Operation of the TDLR is further discussed in the co-pending patent application entitled "SYSTEM AND METHOD FOR DELAY LINE TESTING," which is also incorporated herein by reference in its entirety.

Figure 1:
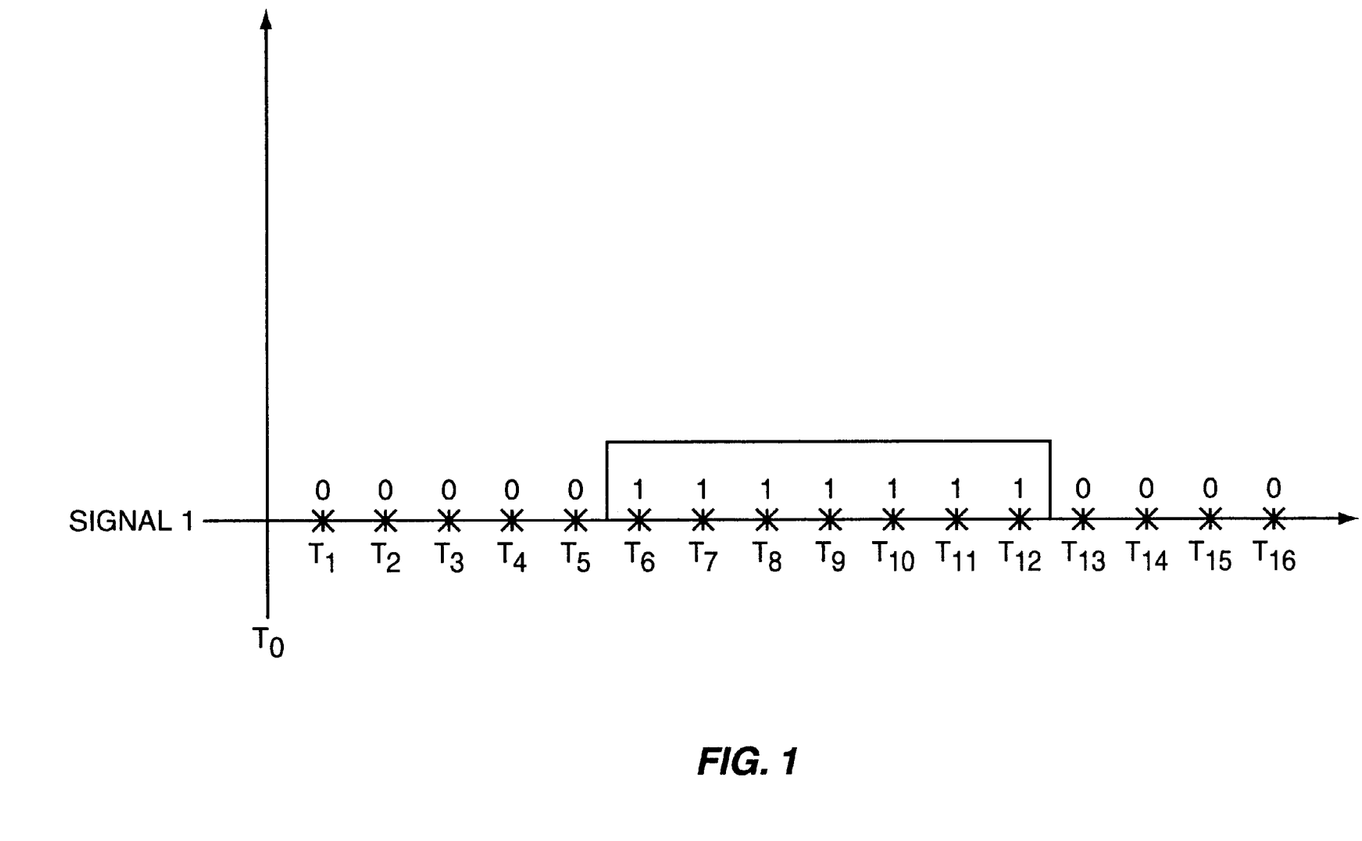
FIG. 1 is a graph of exemplary waveform digitization in accordance with the present invention.

Waveform digitization in accordance with the above description is illustrated in the graph of FIG. 1. Signal 1 transitions from low to high at some first point relative to time $T_0$, and at a second, later time, signal 1 transitions back to zero, thus forming a pulse. By sampling signal 1 at regular intervals relative to $T_0$, a system may determine approximate times for the rising and falling edges of signal 1 with respect to time $T_0$ and may further determine an approximate pulse width of signal 1. In the illustration, signal 1 transitions from low (0) to high between sample points $T_5$ and $T_6$. Signal 1 remains high (1) until experiencing a low going transition between sampling points $T_{12}$ and $T_{13}$. Thus, signal 1 may be represented as an initial string of 0's corresponding to sample times $T_0$–$T_5$, followed by a string of 1's corresponding to sample times $T_6$–$T_{12}$, followed by a terminating string of 0's corresponding to sample times $T_{13}$–$T_{16}$.

Figure 2:
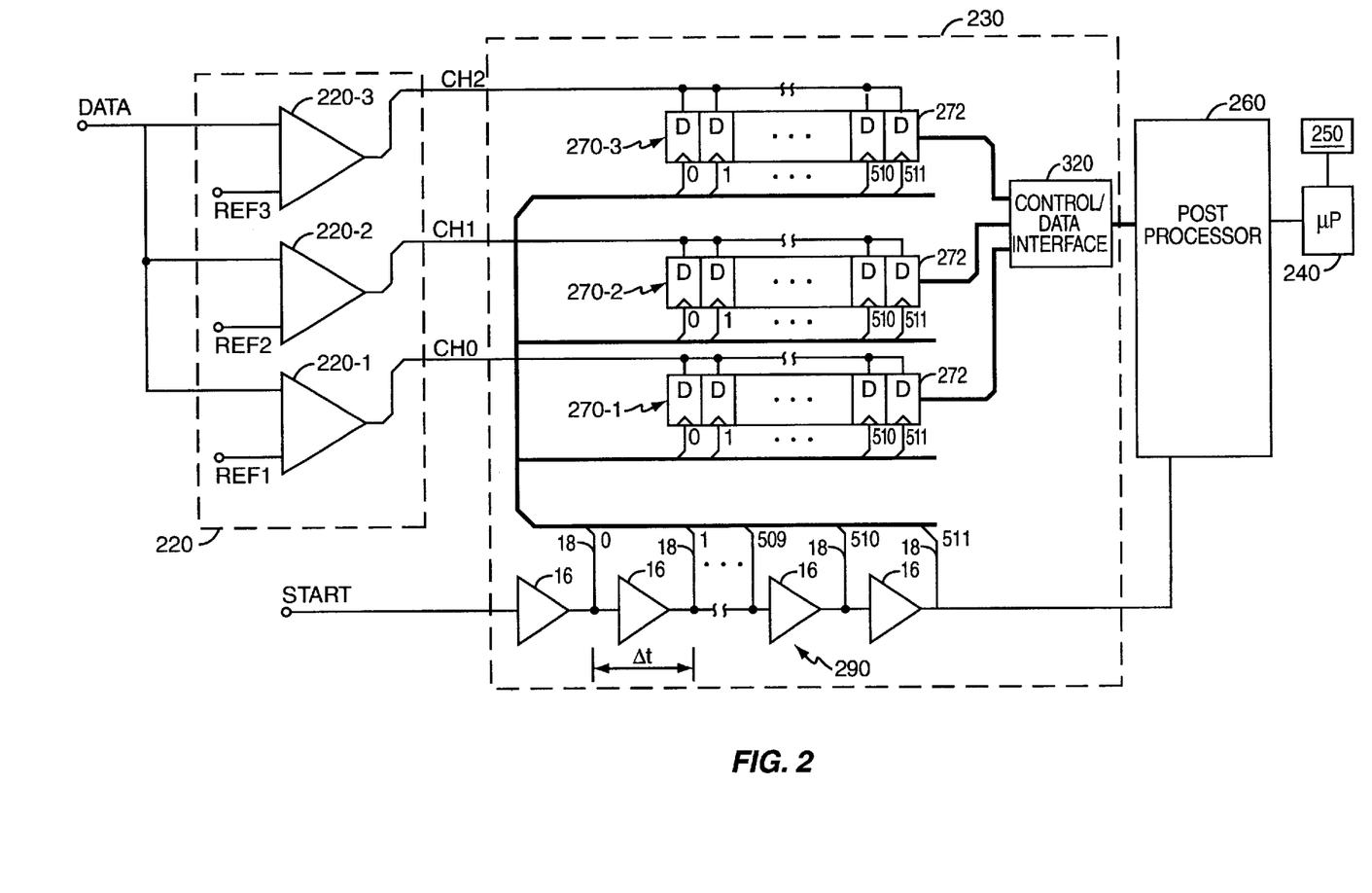
FIG. 2 is a simplified diagram of an exemplary post processor operating in cooperation with a tapped delay line high-speed register.

FIG. 2 illustrates a TDLR-based application where one or more waveforms are digitized and stored in accordance with the above description. A comparator bank 220 generates one or more binary signals (CH0, CH1, and CH2) based on comparing an input data signal to one or more reference thresholds. A TDLR 230 receives the binary-valued input waveforms from the comparator bank 220, and digitizes them in a corresponding number of capture channels 270. Capture timing is controlled by the propagation of a start signal through a high-speed digital delay line 290. Operation of the TDLR 230 is detailed in the earlier incorporated co-pending application. A data interface 320 within the TDLR 230 interfaces the capture registers 270 to a post processor or data reduction circuit 260, which is configured for data reduction operations in accordance with at least some aspects of the present invention. The post processor 260 serves an intermediary role between the TDLR 230 and an associated microprocessor 240.

In preferred embodiments, the TDLR 230 digitizes or records an input waveform as a sequence of 512 binary values, with each value in the sequence captured at a successive delay interval determined by the delay line 290. For example, capture channel 270-1 records 512 samples of the input signal CH0, while capture channel 270-2 simultaneously records the same number of samples of signal CH1. Likewise, capture channel 270-3 simultaneously digitizes the input signal CH2. Of course, the TDLR 230 may have a fewer or a greater number of capture channels 270, and the input waveforms may or may not be generated by the comparator bank 220. In any case, the digitized data held in the TDLR 230 represents long sequences of binary values that, absent operation of the post processor 260, must be transferred to and processed by the microprocessor 240. Because the microprocessor 240 is, in exemplary applications, more concerned with the offset timing of the pulses within the input waveforms (e.g., CH0–CH2), it is not necessary to transfer the entire contents of each capture channel 270 to the microprocessor 240.

Indeed, in many practical implementations, the data and control interface between the TDLR 230 and the microprocessor 240 will be limited in the amount of data that can be transferred between the two devices in a given amount of time. Thus, it may be practically desirable to minimize or reduce the amount of data that must be transferred from the TDLR 230 to the microprocessor 240. In a more generalized sense, it will be commonly desirable to reduce the amount of digitized waveform data that must be transferred from an acquisition sub-system to a processing sub-system.

Figure 3A:
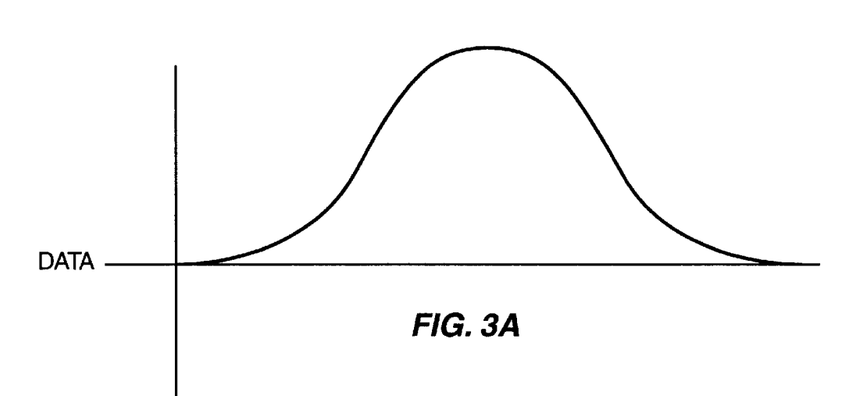
FIG. 3A is a graph of an exemplary data waveform.
Figure 3B:
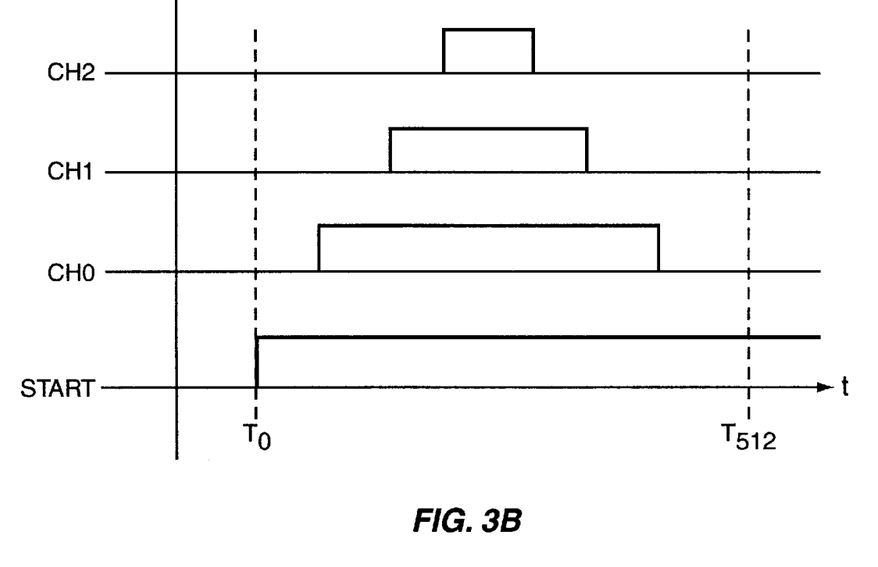
FIG. 3B is a graph of an exemplary set of capture waveforms derived from the data waveform of FIG. 3A.

FIG. 3A is a graph illustrating a typical data signal pulse in laser-based distance measuring applications of the TDLR 230, while FIG. 3B illustrates a typical output from the comparator bank 220 for the data signal pulse shown in FIG. 3A. The graph of FIG. 3B assumes that the reference threshold for the CH0 signal is lower than that of the CH1 signal, and that, likewise, the reference point for the CH1 signal is lower than that of the CH2 signal. Thus, the TDLR 230 digitizes a set of related pulses of varying widths determined by the characteristics of the data signal and of the comparison thresholds in the comparator bank 220. It should be understood, that the data signal may itself comprise a series of pulses so that the input waveforms (CH0–CH2) to the TDLR 230 may themselves comprise a plurality of pulses rather than just a single pulse per input channel.

Figure 4:
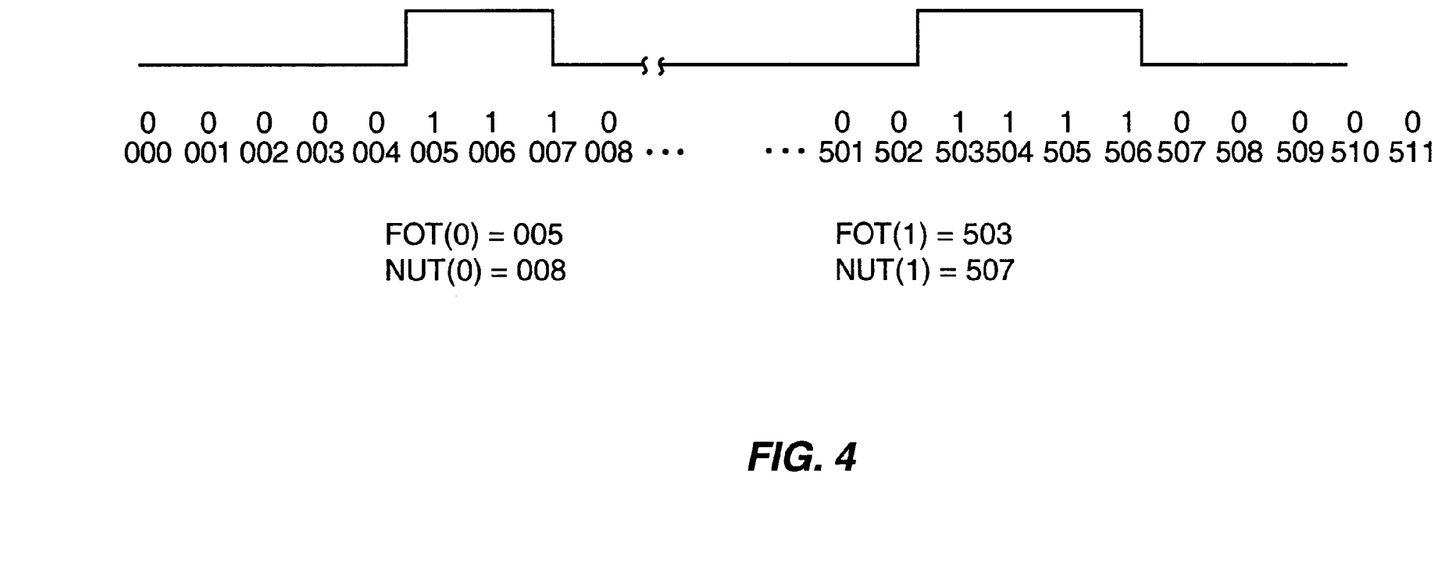
FIG. 4 is a graph of exemplary data clustering in at least one embodiment of the present invention.

FIG. 4 illustrates data clustering in accordance with at least some embodiments of the present invention. While operation on the sequence of values captured in a capture channel 270 of the TDLR 230 is illustrated, it should be understood that the data reduction techniques of the present invention can be more broadly applied to any system where digitized waveforms are processed.

FIG. 4 illustrates a binary valued waveform having at least two pulses in series. Two rows of numbers are depicted below the waveform, with the top row indicating the binary values of corresponding waveform sample values, and the bottom row depicting the corresponding discrete sample numbers. Waveform processing involves in at least some embodiments of the present invention, identification of the sample numbers corresponding to waveform transition points.

In the illustration, the input waveform transitions from low to high (0 to 1) between sample numbers 4 and 5, remains high until transitioning low again between sample numbers 7 and 8. The waveform remains low until transitioning high again between sample numbers 502 and 503, and remains high until a final low going transition between sample numbers 506 and 507. The first pulse may be identified by specifying the corresponding high-going and low-going transition points in the input waveform.

Thus, the first high going transition in the input waveform may be denoted as FOT (0) where FOT means "First Over Threshold," and the "(0)" indicates the first detected high-going transition in the input waveform. Thus, the FOT (0) value equals 5, indicating that the first FOT event occurred at sample number 5. The corresponding NUT (0) value is 8, indicating that the corresponding "Next Under Threshold" event occurred at sample number 8. Similarly, for the second detected pulse in the input waveform, the FOT (1) value equals 503, while its corresponding NUT (1) value equals 507, indicating that the second detected pulse ran from sample number 503 to sample number 507. Again, these sample numbers are exemplary only and correspond to the illustrated waveform of FIG. 4.

With the above framework in mind, the data reduction circuit 260 received 512 discrete waveform samples from the TDLR 230, yet needs only report two pairs of sample numbers to the microprocessor 240 to completely describe the salient features of the captured waveform. Specifically, the data reduction circuit 260 reports the sample number pairs, FOT(0)/NUT(0) and FOT(1)/NUT(1), corresponding to the two pulses contained in the captured waveform. With this scheme, the amount of data transferred between the TDLR 230 and the microprocessor 240 is greatly reduced. As alluded to earlier, the same beneficial reductions in data transfer requirements may be applied in a broad range of data acquisition applications.

The above example may be extended to include multiple captured waveforms, with the data reduction circuit reporting sample numbers for signal transitions or other events in each of the captured waveform sample sets. Further, the FOT/NUT scheme may be extended to provide for reporting essentially any number of successive pulses in a singled captured waveform, or may be altered to report any salient event of interest in the captured data set. For example, the data reduction circuit may report other statistics for a captured sample set, such as the number of high sample value occurrences, or a summary of the number of separate pulses within a signal captured waveform, or the offset and width of the largest recorded pulse. Obviously, any number of other parameters may be determined for captured waveform data and reported by the data reduction circuit 260.

Figure 5:
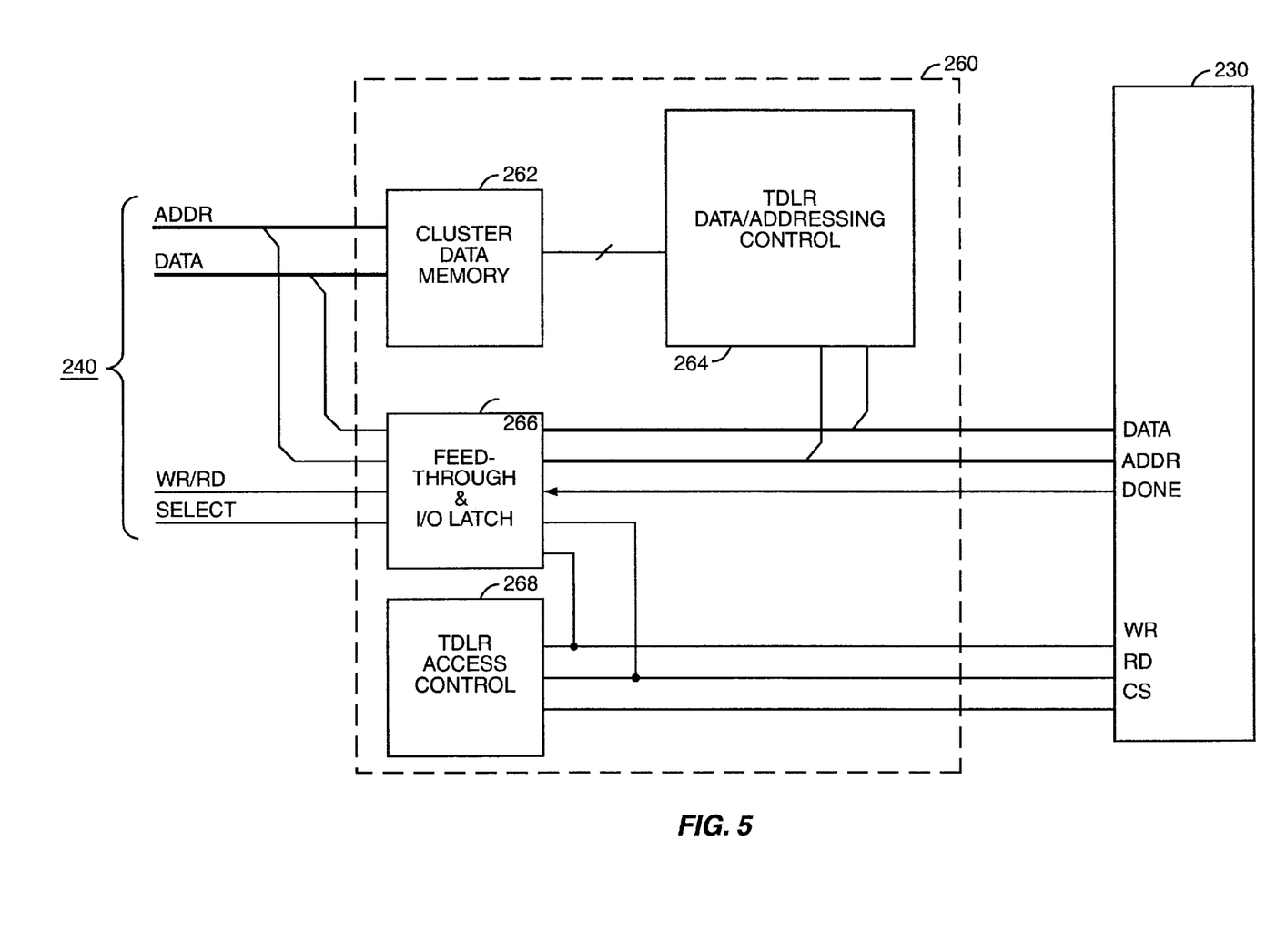
FIG. 5 is a simplified diagram of an exemplary architecture for the post processor of FIG. 2.

FIG. 5 illustrates an exemplary arrangement from the data reduction circuit 260. In the illustration, the data reduction circuit 260 comprises cluster data memory 262, data/addressing and control circuits 264, feedthrough and latching circuits 266, and access control circuits 268. Preferably, the data reduction circuit 260 provides an interface between the TDLR 230 or, in more general terms, a data acquisition device, and the microprocessor 240. Preferably, the data reduction circuit 260 accommodates the data and control bus scheme implemented on the microprocessor 240. Such microprocessor interface buses are well understood by those skilled in the art and allow the data reduction circuit 260 and the TDLR 230 to be interfaced to the microprocessor 240 as memory-mapped I/O circuits, or other such standard peripheral interface circuits. Preferably, the data reduction circuit 260 provides a feedthrough function so that the microprocessor 240 can directly access and control the TDLR 230 when desired. This might be useful when, for example, the microprocessor 240 wants to directly write to or read from the TDLR 230.

The cluster data memory 262 holds the reduced data set provided by the data reduction circuit 260 to the microprocessor 240. While this reduced data set preferably comprises the FOT/NUT values for one or more TDLR capture channels 270, it may include a variety of other items, such as the additional waveform parameters discussed earlier.

Here, the data/addressing and control circuits 264 read data from the TDLR control channels 270, and provide the reduced data set for storage in cluster data memory 262. In a more generalized application, the data/addressing and control circuits 264 would be configured to accommodate the needs to the data acquisition device (e.g., waveform digitizer) to which the data reduction circuit 260 was attached.

The feed-through and I/O latch circuits 266 provide access to the data and address lines of the TDLR 230 and allow the microprocessor 240 to directly read from and write to the TDLR 230. The TDLR access control circuits 268 provide the TDLR 230 with control lines, such as read, write, and chip select based on the read/write and select activities of the microprocessor 240 to facilitate direct access and control of the TDLR 230 by the microprocessor 240. It should be understood that these interface and control features of the data reduction circuit may be modified or altered as needed in non-TDLR applications.

Figure 6:
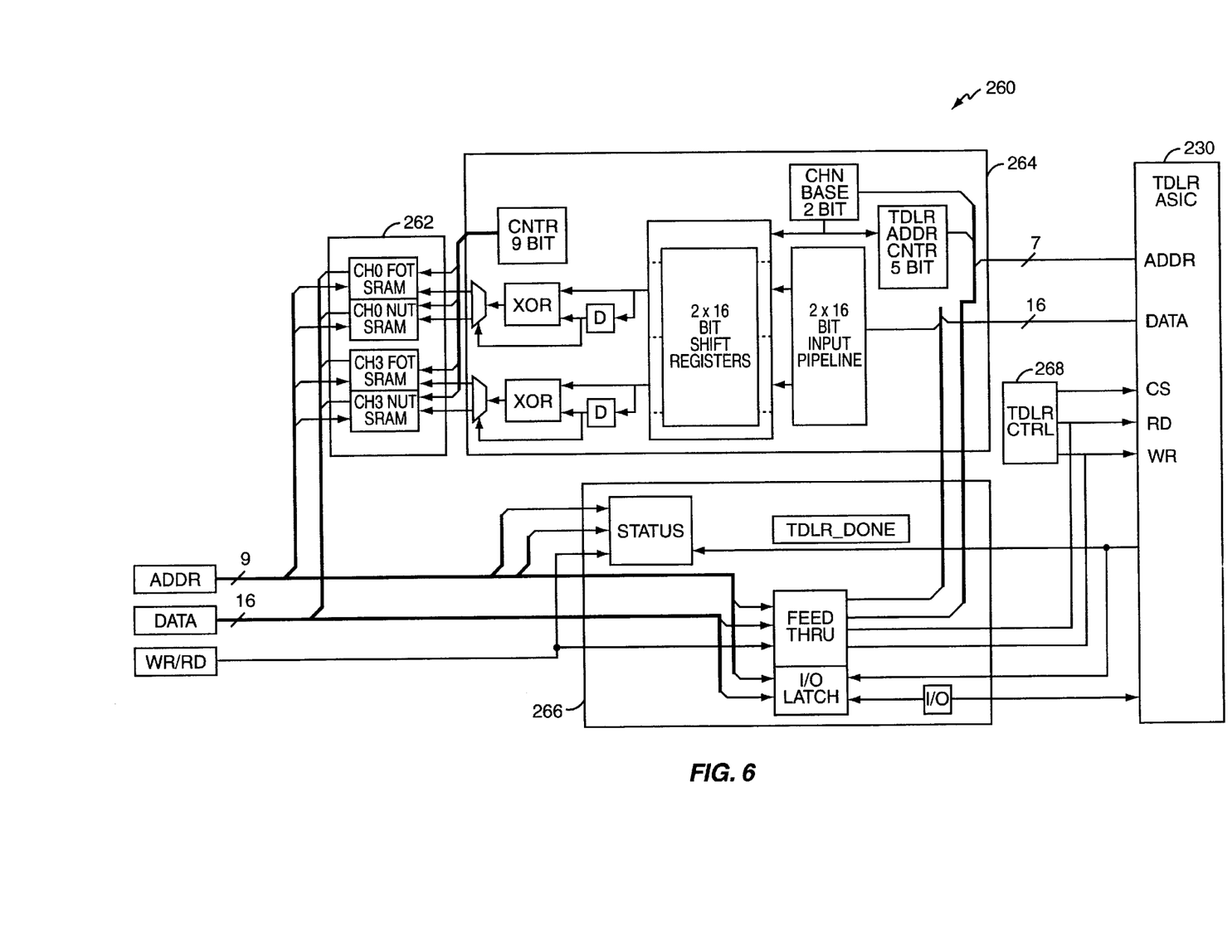
FIG. 6 is a more detailed diagram of the post processor of FIG. 5.

FIG. 6 provides exemplary details for the internal structure of the data reduction circuit elements illustrated in FIG. 5. The capture data memory 262 preferably comprises blocks of embedded memory, such as static RAM (SRAM), which holds the FOT and NUT values for each capture channel in the TDLR 230. The TDLR data/addressing and control circuits 264 preferably comprise address generators, which may be counters, and shift registers for bringing in the sequential binary data from the TDLR capture channels 270, and further includes processing logic for identifying the signal transition points or other events of interest in the binary sequences read in from the TDLR 230. This processing logic provides the FOT/NUT sample number pairs for storage in the capture data memory 262.

Finally, the feed-through and I/O latching circuits 266 and TDLR access control circuits 268 comprise a collection of logic circuits that create a buffered address and data bus for use by the data reduction circuit 260 and TDLR 230 that may be passed through or interconnected with the microprocessor address and data buses.

The data reduction circuit 260 may be realized in some form of programmable or configurable logic. Advantages of forming the data reduction circuit 260 in this manner include the ability to process much of the sequential data retrieved from the TDLR 230 in parallel, with attendant reductions in processing time. For example, in the illustrated example, sequential data from a TDLR capture channel 270 is read into the data reduction circuit in 16-bit blocks or words. Each of these 16-bit words may be presented to the processing logic of the data/addressing and control circuits 264 as parallel sets of 16 bits (binary valued samples). Thus, the processing logic of the data reduction circuit 260 may be made to process waveform samples in parallel, with significant speed advantages over the serial processing associated with conventional microprocessors.

Technologies that provide exemplary bases for implementing the data reduction circuit 260 include but are not limited to field programmable gate arrays (FPGAs), complex programmable logic devices (CPLDs), and application specific integrated circuits (ASICS). It should be noted that with the range of programmable or custom logic systems available, data acquisition and data reduction functions may be integrated into a common device. As an example, the data reduction circuit 260 and the TDLR 230 may be implemented together in an ASIC device.

Of course, the structure of the data reduction circuit 260 may, as noted earlier, be altered to suit the particular interface needs of the microprocessor 240, or of the particular waveform digitization device used. Again, the use of configurable logic circuits in implementing the data reduction circuit 260 allows significant flexibility in terms of varying its implementation details. For example, the bus interface presented by the data reduction circuit 260 to the microprocessor 240 may be varied as needed to accommodate differing types of microprocessors that may use different bus timing or different control signals.

In any case, the above discussion includes illustrative details that are exemplary only and should not be considered as limiting the scope of the present invention. Indeed, the scope of the present invention is limited only by the following claims and their reasonable equivalents.

What is claimed is:

1. A circuit receiving a sequence of binary digits representing a waveform and generating a reduced output for further processing, said reduced output comprising a set of sequence numbers corresponding to transitions in said sequence of binary digits, said circuit comprising:
   a first data interface operative to receive said sequence of binary digits;
   a second data interface operative to output said set of sequence numbers; and
   processing logic operative to generate said set of sequence numbers by processing said sequences of binary digits.

2. The circuit of claim 1 wherein said circuit comprises a field programmable gate array (FPGA).

3. The circuit of claim 1 wherein said circuit comprises a complex programmable logic device (CPLD).

4. The circuit of claim 1 wherein said circuit comprises an application specific integrated circuit (ASIC).

5. The circuit of claim 1 further comprising a waveform digitizer operative to generate said sequence of binary digits based on digitizing an input waveform.

6. The circuit of claim 5 wherein said waveform digitizer comprises a digital delay line-based waveform capture circuit operative to sample the input waveform at discrete sample times corresponding to successive delay taps defined by said digital delay line.

7. The circuit of claim 1 wherein said first data interface comprises:
   an address generator and associated address bus operative to generate address values for reading out said sequence of binary digits from memory address locations in an associated waveform digitizer storing said sequence of binary digits; and
   a data bus operative to receive said sequence of binary digits read out from the waveform digitizer.

8. The circuit of claim 1 wherein said second data interface comprises a read interface operative to interface said circuit with an associated processor, such that the associated processor can read out said set of sequence numbers from said circuit.

9. The circuit of claim 8 wherein said second data interface comprises data memory operative to hold said set of sequence numbers for transfer to the associated processor.

10. The circuit of claim 1 wherein said processing logic comprises an arrangement of logic circuits operative to identify transition points in said sequence of binary digits.

11. The circuit of claim 10 wherein said logic circuits comprise logic gates operative to generate cluster data identifying sequence numbers corresponding to said transition points.

12. The circuit of claim 10 wherein said logical circuits comprise logic gates operative to generate sets of sequence numbers as sequence number pairs based on identifying a first transition in said sequence of binary digits where said binary digits change from a first value to a second value, and identifying a second, subsequent transition where said binary digits change back to said first value.

13. The circuit of claim 12 wherein said first data interface further comprises data memory, and wherein said logic gates further comprise memory interface circuits operative to write said sequence number pairs into said data memory.

14. A circuit comprising:
   a digital delay-line based waveform digitizer operative to generate a sequence of binary digits based on sampling an input waveform at discrete sample points timed by said digital delay line; and
   a data reduction circuit operative to receive said sequence of binary digits from said waveform digitizer and to generate sets of sequence numbers corresponding to transitions within said sequence of binary digits.

15. The circuit of claim 14 wherein said data reduction circuit comprises a logic device operative to identify sequence numbers corresponding to said transitions within said sequence of binary digits, wherein a sequence number identifies a position of a binary digit within said sequence of binary digits representing a transition from a first binary value to a second binary value.

16. The circuit of claim 14 wherein said data reduction circuit comprises a field programmable gate array (FPGA).

17. The circuit of claim 14 wherein said data reduction circuit comprises a complex programmable logic device (CPLD).

18. The circuit of claim 14 wherein said data reduction circuit comprises an application specific integrated circuit (ASIC).

19. The circuit of claim 14 wherein said waveform digitizer and said data reduction circuit comprise portions of an integrated circuit device.

20. The circuit of claim 14 wherein said data reduction circuit comprises processing logic operative to identify pairs of sequence numbers corresponding to a first transition in said sequence of binary digits from a first digital value to a second digital value, and to a second, subsequent transition back to said first digital value.

21. The circuit of claim 20 wherein said data reduction circuit further comprises data memory operative to hold said pairs of sequence numbers.

22. The circuit of claim 21 wherein said data reduction circuit further comprises a first data interface operative to interface said data memory to an external processor.

23. The circuit of claim 14 wherein said waveform digitizer comprises:
   a digital delay line comprising a succession of interconnected delay stages, each said delay stage providing a delay tap output signal corresponding to a delay line sample time; and
   at least one capture channel comprising a set of digital capture registers, each said digital capture register having a data input commonly connected to a waveform input, and having a capture clock input individually connected to a respective one of said delay tap output signals, such that each said capture register records a binary state of an input waveform at one of said delay line sample times;
   wherein said capture channel captures said sequence of binary digits processed by said data reduction circuit.

24. The circuit of claim 14 wherein said data reduction circuit comprises:
   a first data interface operative to store said set of sequence numbers, and to transfer said set of sequence numbers to an external processor;
   a second data interface operative to receive said sequence of binary digits from said waveform digitizer; and
   processing logic operative to generate said set of sequence numbers based on processing said sequence of binary digits.

25. A method of reducing data transfer between a waveform digitizer that digitizes a waveform as a sequence of binary values and an associated processor concerned with processing the binary values, the method comprising:
   determining which binary values in said sequence of binary values represent waveform transition points;
   storing sequence numbers for said binary values corresponding to said transition points; and
   transferring said sequence numbers to the associated processor.

26. The method of claim 25 further comprising generating said sequence of binary values based on sampling an input waveform at discrete sampling points.

27. The method of claim 26 wherein sampling an input waveform at discrete sampling points comprises recording digital samples of said input waveform at sampling intervals determined by a digital delay line, wherein said digital delay line comprises successive delay stages, each successive delay stage representing a successive delay interval.

28. The method of claim 25 further comprising determining pairs of sequence numbers corresponding to a related pair of transitions in said sequence of binary values.

29. The method of claim 28 further comprising transferring said pairs of sequence numbers to the associated processor.

30. The method of claim 25 further comprising determining sequence numbers corresponding to one or more transition points in a plurality of sequences of binary values corresponding to a like plurality of digitized waveforms.

31. The method of claim 25 further comprising identifying a pulse width of a pulse in said digitized waveform by identifying a first digital value in said sequence of digital values corresponding to a change in said digital values from a first value to a second value, and identifying a second, subsequent digital value corresponding to change in said digital value back to said first value.

32. The method of claim 31 further comprising storing a pair of sequence numbers corresponding to said first and second digital values.

33. The method of claim 32 further comprising storing a plurality of pairs of sequence numbers corresponding to pluralities of associated said first and second digital values.

* * * * *